United States Patent
Chan et al.

(10) Patent No.: US 7,149,903 B1
(45) Date of Patent: Dec. 12, 2006

(54) SYSTEM AND METHOD FOR SIGNAL DELAY IN AN ADAPTIVE VOLTAGE SCALING SLACK DETECTOR

(75) Inventors: Wai Cheong Chan, Sunnyvale, CA (US); Donald Kevin Cameron, Mountain View, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 695 days.

(21) Appl. No.: 10/324,997

(22) Filed: Dec. 18, 2002

(51) Int. Cl.
*G06F 1/26* (2006.01)
*H03K 27/00* (2006.01)

(52) U.S. Cl. ..................... 713/300; 377/129
(58) Field of Classification Search ............... 713/300; 377/129
See application file for complete search history.

(56) References Cited

U.S. PATENT DOCUMENTS

| | | | | |
|---|---|---|---|---|
| 4,210,054 A | * | 7/1980 | Howell et al. | 84/682 |
| 5,128,624 A | * | 7/1992 | Hoshino et al. | 327/3 |
| 5,289,135 A | * | 2/1994 | Hoshino et al. | 327/3 |
| 5,396,247 A | * | 3/1995 | Watanabe et al. | 341/157 |
| 5,790,612 A | * | 8/1998 | Chengson et al. | 375/373 |
| 6,011,749 A | * | 1/2000 | Roth et al. | 365/233 |
| 6,157,247 A | * | 12/2000 | Abdesselem et al. | 327/540 |
| 6,424,184 B1 | * | 7/2002 | Yamamoto et al. | 327/102 |
| 6,548,991 B1 | * | 4/2003 | Maksimovic et al. | 323/224 |
| 6,741,107 B1 | * | 5/2004 | Borkar et al. | 327/153 |
| 6,868,503 B1 | * | 3/2005 | Maksimovic et al. | 713/401 |
| 6,944,780 B1 | * | 9/2005 | Kranzen et al. | 713/300 |

* cited by examiner

Primary Examiner—Thomas Lee
Assistant Examiner—Ji H. Bae

(57) ABSTRACT

A system and method for slack determination in a logic integrated circuit. A launch pulse is input to a circular delay loop circuit. The leading edge of the launch pulse causes a pulse to circulate around the circular delay loop. The number of passes made through the loop by the circulating pulse is counted by a latch/counter circuit. A sample pulse is input to the latch/counter circuit to latch the number of pulse circulations at the leading edge of the sample pulse. The pulse circulation count provides delay information in the circuit that may subsequently be used to adjust a supply voltage in the integrated circuit.

20 Claims, 15 Drawing Sheets

SYSTEM AND METHOD FOR SIGNAL DELAY IN AN ADAPTIVE VOLTAGE SCALING SLACK DETECTOR

RELATED US APPLICATIONS

This patent application is related to U.S. application Ser. No. 10/053,828, filed Jan. 19, 2002, titled "SYSTEM FOR ADJUSTING A POWER SUPPLY LEVEL OF A DIGITAL PROCESSING COMPONENT AND METHOD OF OPERATING THE SAME." The above application is commonly assigned to the assignee of the present invention, and is incorporated in its entirety herein by reference.

FIELD OF THE INVENTION

Embodiments of the present invention relate to the field of power management for integrated circuits (ICs). More particularly, embodiments of the present invention relate to a slack detector for adaptive voltage scaling.

BACKGROUND ART

Advances in fabrication technology have resulted in high transistor counts and a high degree of integration of functions in ICs. However, this increased computational capability has an associated increase in capability for power consumption.

For mobile devices that are battery operated, such as cell phones, it is desirable to minimize power consumption in order to extend battery life. Control of power dissipation is also desirable in devices with high density ICs, mobility notwithstanding, in order to avoid operational instability and thermal damage.

For purposes of power consumption analysis, a logic IC may be viewed as a network of resistances and capacitances as a first approximation. The power dissipation in a logic IC is proportional to the product of the capacitance (C), square of the operating voltage ($V^2$), and the operating frequency (f): $P \propto CV^2 f$.

Since the capacitance associated with in IC is largely fixed by the design and fabrication process, the operating voltage and operating frequency are typically the focus for power management.

The time needed for the propagation of a signal within an IC varies with the signal path, and the time required for propagation along the slowest path typically places an upper limit on the operating frequency of an IC at a given voltage. Also, the maximum operating frequency is directly proportional to the operating voltage since an increase in voltage results in faster switching of the transistors in the IC.

In order to provide reliable operation, the operating frequency and operating voltage are typically selected so that signal will propagate along a critical path in a time that is shorter than the maximum allowable time. The difference between the actual operational propagation time and the maximum allowable for proper operation is referred to as "slack". The slack in a circuit or subcircuit is dependent upon the operating frequency and voltage.

Typically, slack may be determined a priori by modeling techniques, and a table of safe operating frequency and voltage combinations may be developed for power management. However, since the frequency and voltage combinations are based upon a model, and must allow for model errors and fabrication process variations, the voltage reduction that is associated a given frequency reduction does not provide an optimal reduction in power consumption.

What is needed is a method for accurate determination of slack in an integrated circuit that accommodate fabrication process variations and avoids modeling errors. It is also desirable that the system be efficient and require a minimum amount of substrate area for implementation.

SUMMARY OF INVENTION

Accordingly, embodiments of the present invention provide a circuit and method for slack detection in a logic integrated circuit. Embodiments of the present invention provide a compact circuit that accurately maintains the appropriate slack in a circuit or subcircuit for a particular operating frequency by adjusting the supply voltage.

A system and method for slack determination in a logic integrated circuit is disclosed. A launch pulse is input to a circular delay loop circuit. The launch pulse causes a pulse to circulate around the circular delay loop. The number of passes made through the loop by the circulating pulse is counted by a counter/latch circuit. A sample pulse is input to the counter/latch circuit to latch the number of pulse circulations at the leading edge of the sample pulse. The pulse circulation count provides delay information in the circuit that may subsequently be used to adjust a supply voltage in the integrated circuit.

In an embodiment of the present invention, an edge detector/pulse generator circuit has an input for receiving a launch pulse, and an output coupled to a first input of a multiplexer. The launch pulse input is also coupled to a delay element having an input coupled to a control input of the multiplexer. The output of the multiplexer is coupled to the input of a delay element having an output coupled to the input of a counter/latch circuit and to the input of a pulse regenerator circuit having an output coupled to the second input of the multiplexer.

In another embodiment of the present invention, a two input XOR gate has a first input for receiving a launch pulse, and an output coupled to a delay element. An output of the delay element is coupled to the second input of the XOR gate and to an input to a counter/latch circuit. The delay element may be constructed from standard cells used in the overall integrated circuit design so that the delay characteristics closely track the delay in the integrated circuit as a whole.

These and other objects and advantages of the present invention will no doubt become obvious to those of ordinary skill in the art after having read the following detailed description of the preferred embodiments which are illustrated in the various drawing figures.

DESCRIPTION OF THE PREFERRED EMBODIMENTS

In the following detailed description of the present invention, a system and method for signal delay in an adaptive voltage scaling slack detector; numerous specific details are set forth in order to provide a thorough understanding of the present invention. However, it will be obvious to one skilled in the art that the present invention may be practiced without these specific details. In other instances well known methods involving well-known circuits, components, interfaces, etc., have not been described in detail so as not to unnecessarily obscure aspects of the present invention.

Figure 1A:
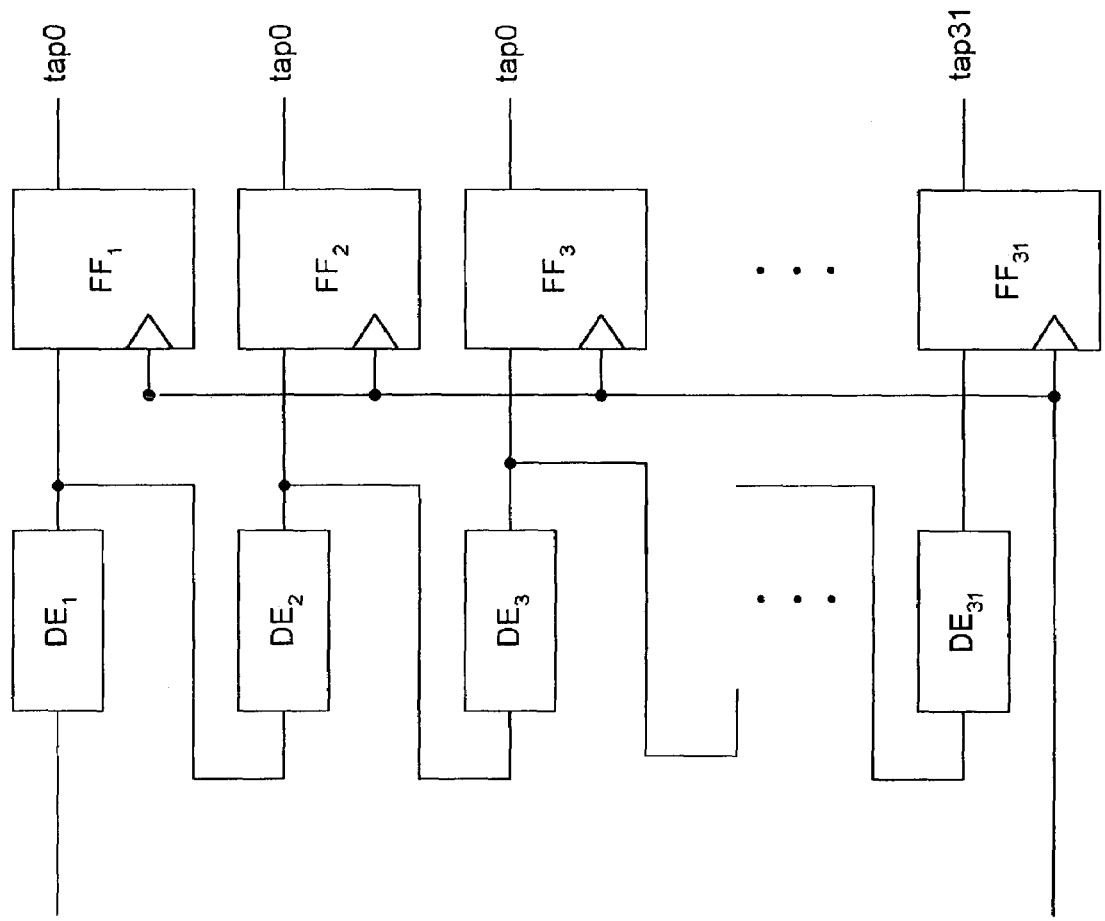
FIG. 1A shows a linear delay line and associate delay characteristics.

FIG. 1A shows a linear delay line comprising a chain of delay elements $D_{E1}$ through $DE_{32}$. The output of each delay element is coupled to a respective flip-flop $FF_1$ through $FF_{32}$. The output of each flip-flop provides a respective tap1 through tap32. The signal propagation behavior of the delay line tracks the behavior of the IC.

The delay line is driven by the same clock and voltage supply as the IC (or portion thereof) for which it is being used to determine slack. In response to a change in clock frequency, the signal propagation behavior of the delay line may be examined in order to adjust the voltage supply. Typically, program execution in a logic IC is suspended while the frequency and voltage adjustments are being made by the system.

When implemented in a logic IC, the delay line of FIG. 1A may be used to evaluate the delay behavior in the circuit. This may be done by applying a pulse to the linear delay line at $DE_1$, and subsequently applying a sample pulse to the flip-flops $FF_1$–$FF_{32}$. As shown, in the time interval $\Delta t$ between the launch edge and the sample edge, the launch edge will propagate through delay line and set the input to each flip-flop to high as the edge passes the delay element associated with the flip-flop.

The value of $\Delta t$ is a function of the phase shift between the launch and sample pulse waveforms, and frequency of the waveforms. The launch and sample waveforms are slaved to a master clock that drives the circuit or subcircuit for which the delay line is designed. Adjustments to the master clock frequency are reflected in the frequency of the launch and sample waveforms. The edge of the sample pulse latches the inputs to $FF_1$–$FF_{32}$, providing a "snapshot" of the slack in the circuit.

The number of delay elements and the value of each delay element are selected so that under optimum slack conditions in the integrated circuit (or portion thereof), the launch edge will propagate through half of the delay elements (e.g., $DE_{16}$). When the circuit operating under optimum slack conditions and the clock frequency is changed, propagation distance through the delay line will change.

In order to restore optimum slack conditions after a change in the clock frequency, a series of adjustments may be made to the supply voltage for the integrated circuit (or portion thereof). For example, if the clock frequency is reduced, $\Delta t$ will increase and the launch edge will propagate through a delay element (e.g. $DE_{18}$) past the optimum $DE_{16}$ and this will be reflected in the values stored in $FF_1$–$FF_{32}$. The magnitude and direction of the delay shift may then be used to adjust the supply voltage (in this example, down) in order to restore the desired slack value ($FF_{16}$). The process may be performed iteratively in order to precisely set the slack value.

Figure 1A:
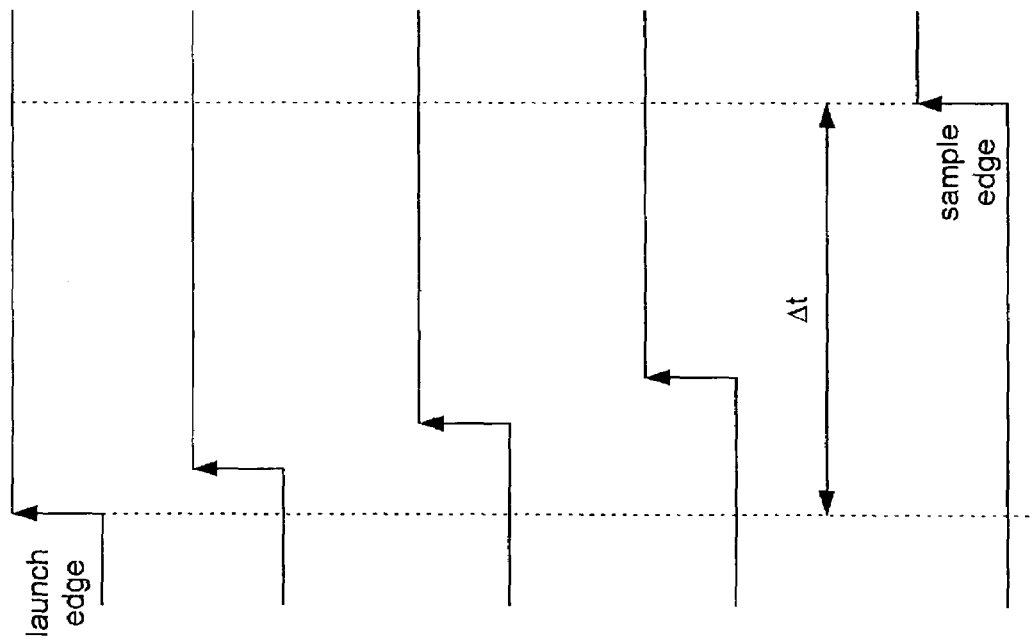
Figure 1B:
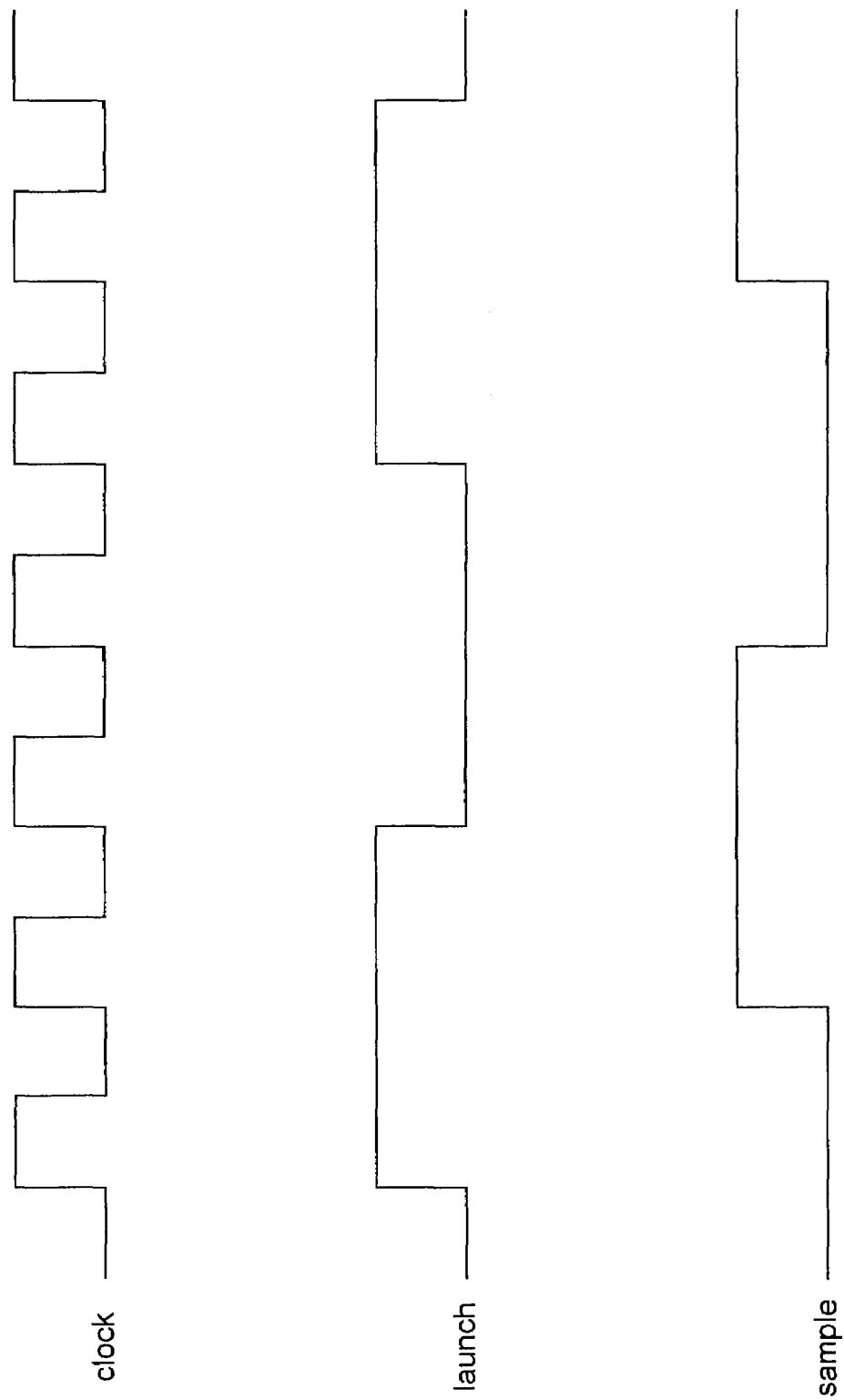
FIG. 1B shows a timing diagram for launch and sample pulses.

FIG. 1B shows an example of a timing relationship between the launch and sample waveforms. In this example, the frequency of the launch and sample waveforms is one fourth of the frequency of the master clock, and the phase difference between the launch waveform and the sample waveform is ninety degrees.

Figure 2A:
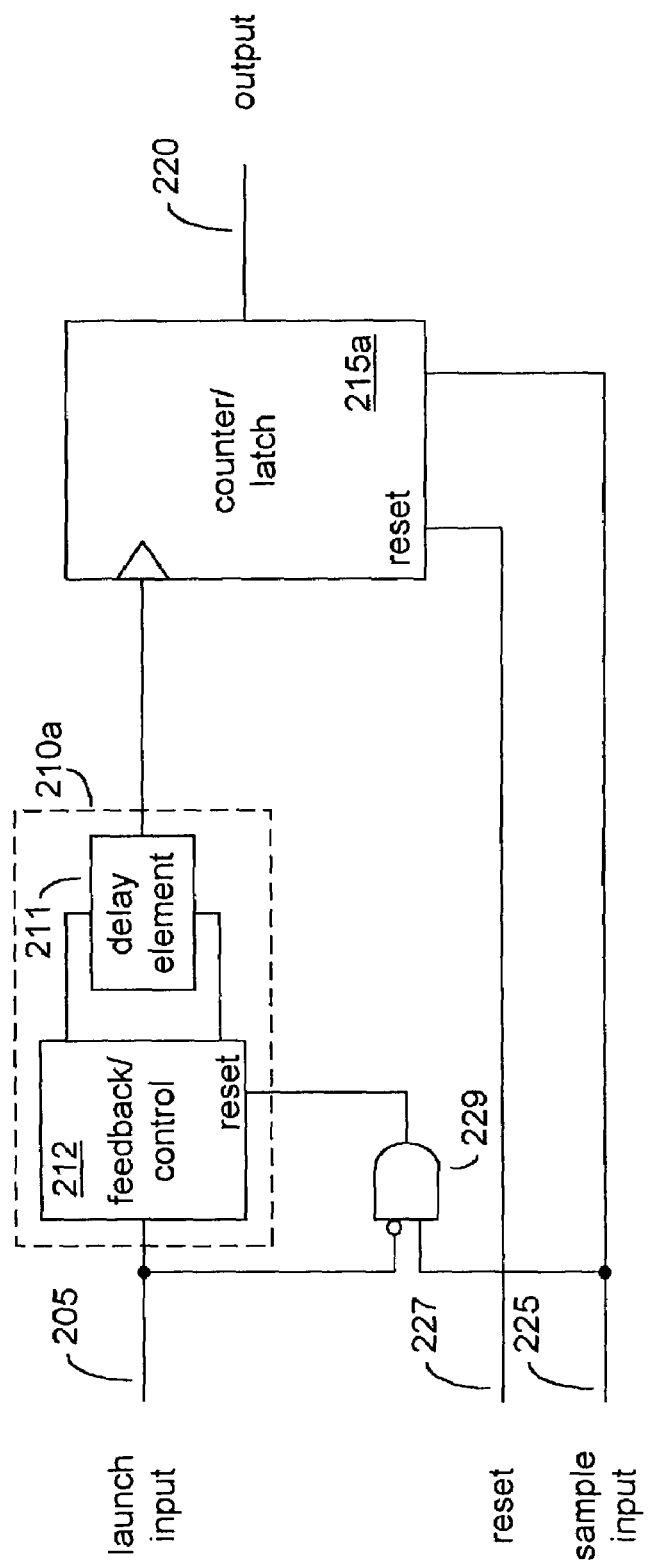
FIG. 2A shows a circulating delay loop comprising a circular delay loop and a counter/latch with internal reset in accordance with an embodiment of the present claimed invention.

FIG. 2A shows a general circuit schematic for a circulating delay loop comprising a circular delay loop 210a and a counter/latch 215a in accordance with an embodiment of the present invention. The circular delay loop 210a comprises a delay element 211 and a feedback circuit 212 that couples the output of the delay element to an input of the delay element. A launch pulse applied to launch input 205 causes a pulse to begin circulating in the loop 210a.

The counter/latch 215a counts the number of times that the pulse circulates in the loop 210a, and in response to a sample pulse at sample input 225, latches the current value for the number of pulses that have passed (pulse circulation count).

As shown in FIG. 2A, AND gate 227 (with inverted launch input) may be used to couple the launch input and sample input to provide a reset signal for the feedback/control circuit 212. Similarly, the external reset signal shown for the counter/latch 215a may be replaced by logic coupling the launch and sample inputs to the reset input of the counter/latch 215a, making an independent reset signal for control unnecessary. Thus, a reset signal may be supplied externally, or derived internally from the launch and sample input signals. Internal reset may be used when the launch and sample input waveforms are single pulse waveforms.

The circulating delay loop of FIG. 2A has a number of advantages when compared to the linear delay line of FIG. 1A. Since it is desirable that the delay element in the delay loop closely track the remainder of the logic circuits in the integrated circuit, the delay line is preferably constructed using similar logic gates and/or cells. These may be standard cells from a design library, (e.g., cascaded NOR gates). The dynamic range of the linear slack detector is dependent upon the number of cascaded gates in the delay line, and the resolution is dependent upon the number of taps. Hundreds of logic gates may be required to provide sufficient dynamic range.

The present invention replaces the chain of delay elements of FIG. 1A with a single delay element 210 and feedback/control logic 212. The flip-flops $FF_1$–$FF_{32}$ are replaced by a counter/latch 215. In general the delay element 210, feedback logic 212, and counter/latch require fewer gates, and thus require less substrate area for implementation.

The circulating delay loop of the present invention as shown in FIG. 2A is also more tolerant of process variations. Since the individual delay elements in the linear delay line are physically discrete devices, variations in the overall delay due to process induced variations in individual elements can produce inaccuracy.

Figure 2B:
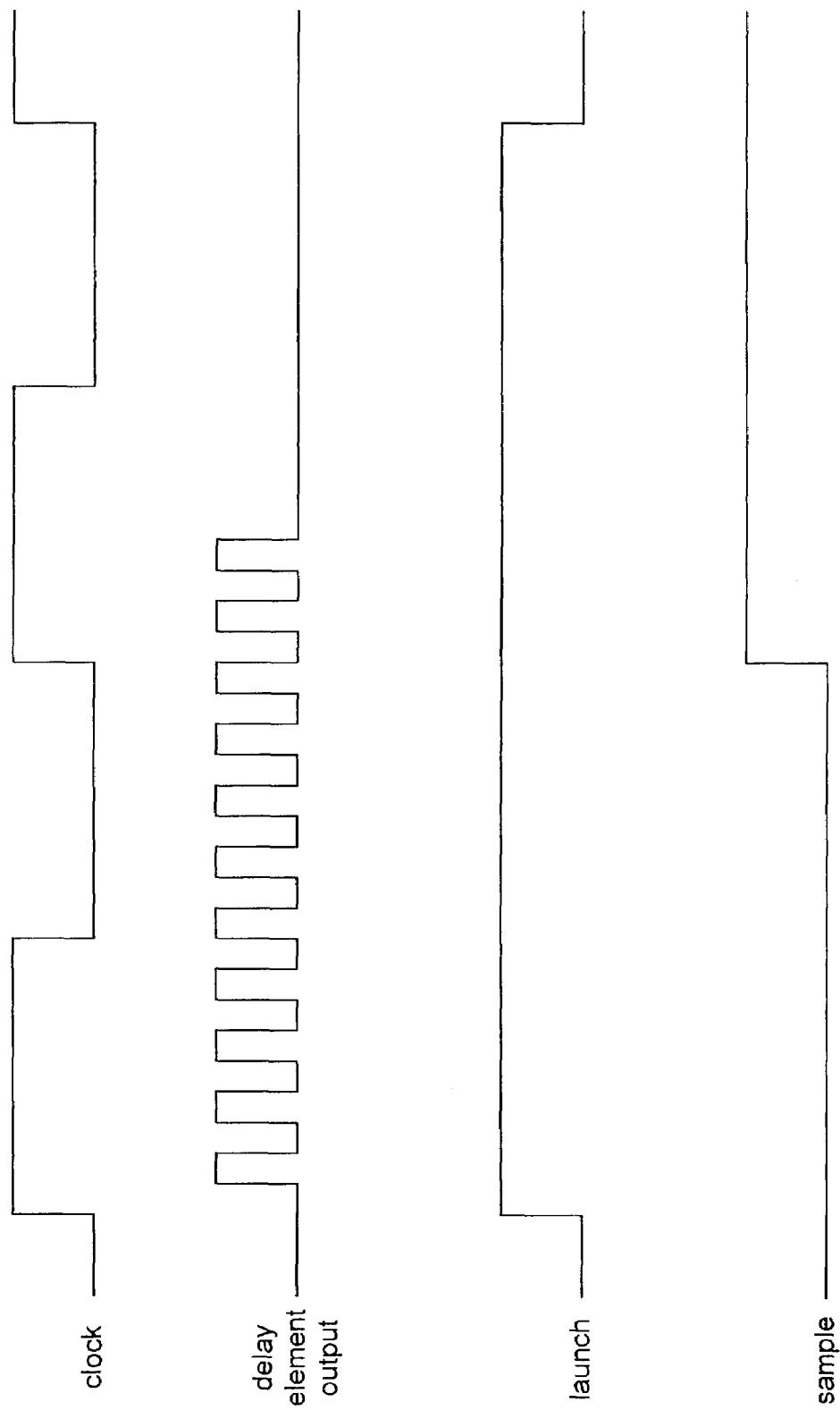
FIG. 2B shows a timing diagram for the circulating delay loop of FIG. 2A.

FIG. 2B shows a timing diagram for the circulating delay loop of FIG. 2A. The clock, launch, and sample waveforms are similar to those of FIG. 1B. The delay element output waveform is the response of the delay loop that is detected by the counter/latch 215a. The width of the counter/latch 215a is determined by the number of pulses that are to be counted. Essentially, the number of pulses that can be counted for a width of n bits=$2^n$–1 pulses. For example, if the delay element 211 has the same delay as delay elements $DE_1$–$DE_{32}$ of FIG. 1A, then a width of 6 bits (maximum pulse count of 63) would provide almost twice the dynamic range of chain $DE_1$–$DE_{31}$.

The efficiency of the circulating delay loop increases exponentially when compared to the linear delay chain. A doubling of dynamic range or resolution requires a doubling of delay elements or taps in the linear delay chain, whereas the resolution or dynamic range may be doubled by increasing the counter/latch width by 1 bit.

Figure 2C:
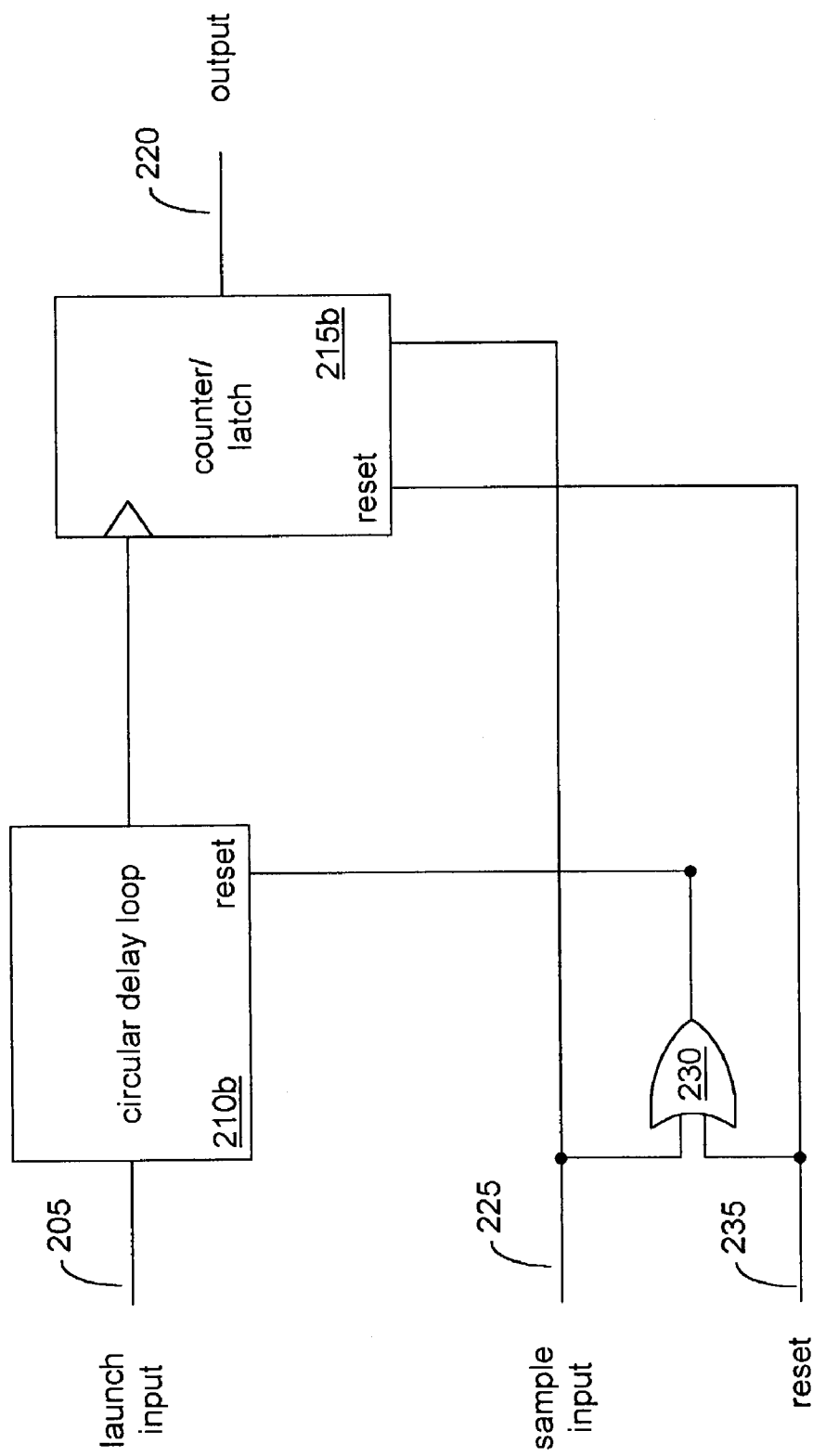
FIG. 2C shows a circulating delay loop comprising a circular delay loop and a counter/latch with external reset in accordance with an embodiment of the present claimed invention.

FIG. 2C shows a circulating delay loop comprising a circular delay loop 210b and a counter/latch 215b with external reset in accordance with an embodiment of the present claimed invention. The circular delay loop 210b comprises a launch input 205 and an output coupled to an input of counter/latch 215b. The counter/latch 215b is coupled a reset input 235. The counter/latch is also coupled to a sample input 225. The circular delay loop 210b comprises a reset input that is coupled to the output of an OR gate 230. The OR gate 230 comprises an input coupled to the sample input 225 and an input coupled to the reset input 235.

In order to enhance the stability of operation, the signal to input to the reset of the circular delay loop 210b may be delayed with respect to the reset signal input to the counter/latch 215b. This delay may be provided internally, or may be added to the signal path between the sample input 225 and the reset input to the circular delay loop 210b.

The OR gate 230 provides a reset signal to the circular delay loop 210b whenever the sample input or reset input is high. For cases in which the launch input and sample input are continuous waveforms, the external reset allows the reset and enable functions to be decoupled from the combined launch and sample inputs.

Figure 2D:
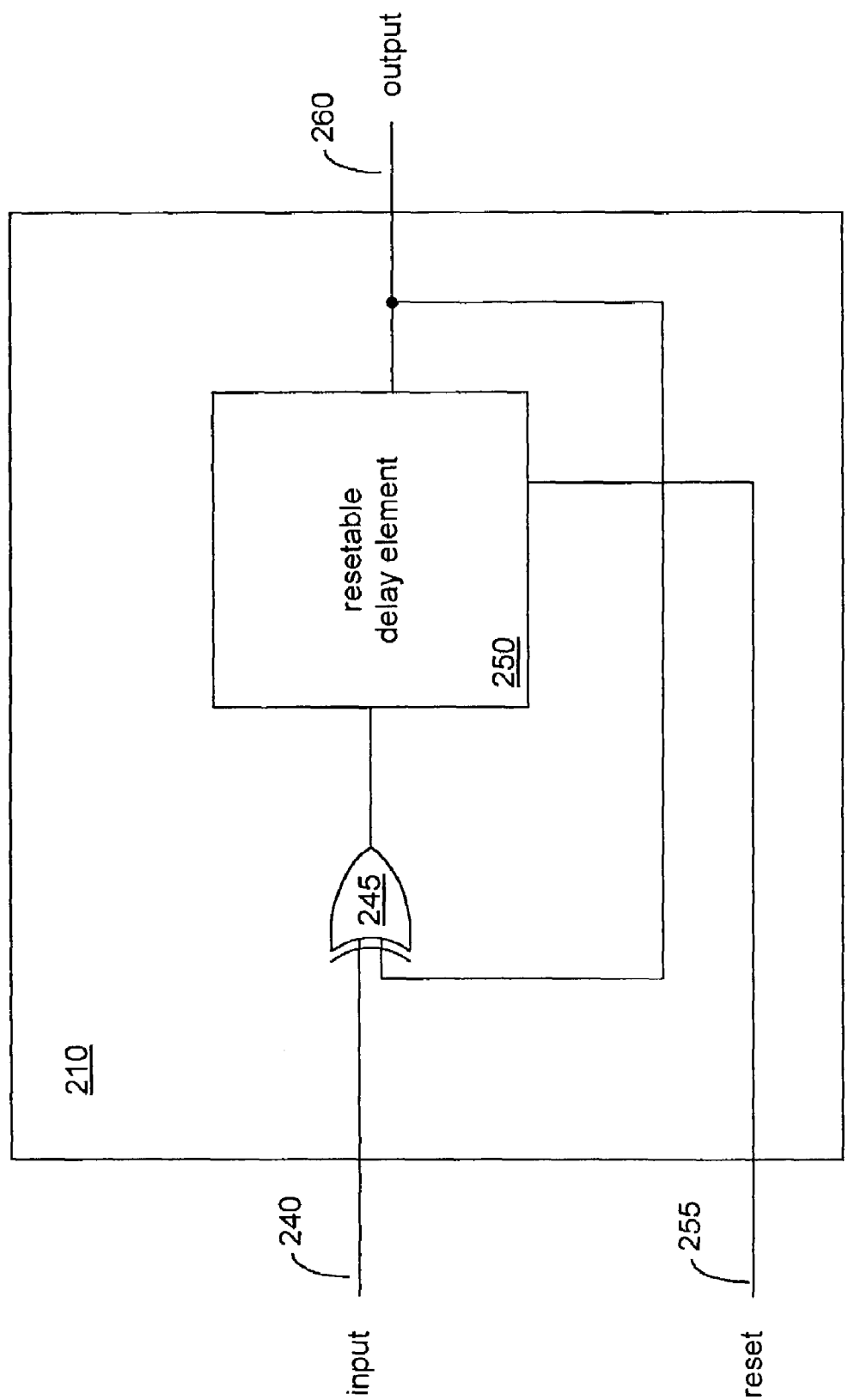
FIG. 2D shows an example of a circular delay loop circuit in accordance with an embodiment of the present claimed invention.

FIG. 2D shows an example of a circular delay loop 210 that may be used as the circular delay loop 210b of FIG. 2C. The delay loop 210 comprises an input 240, a reset input 255 and an output 260. A XOR gate 245 as a first input coupled to the input 240 and a second input coupled to the output 260. The output of the XOR gate 245 is coupled to the input of a resetable delay element 250. The output of the resetable delay element 250 is coupled to the output 260.

Figure 2E:
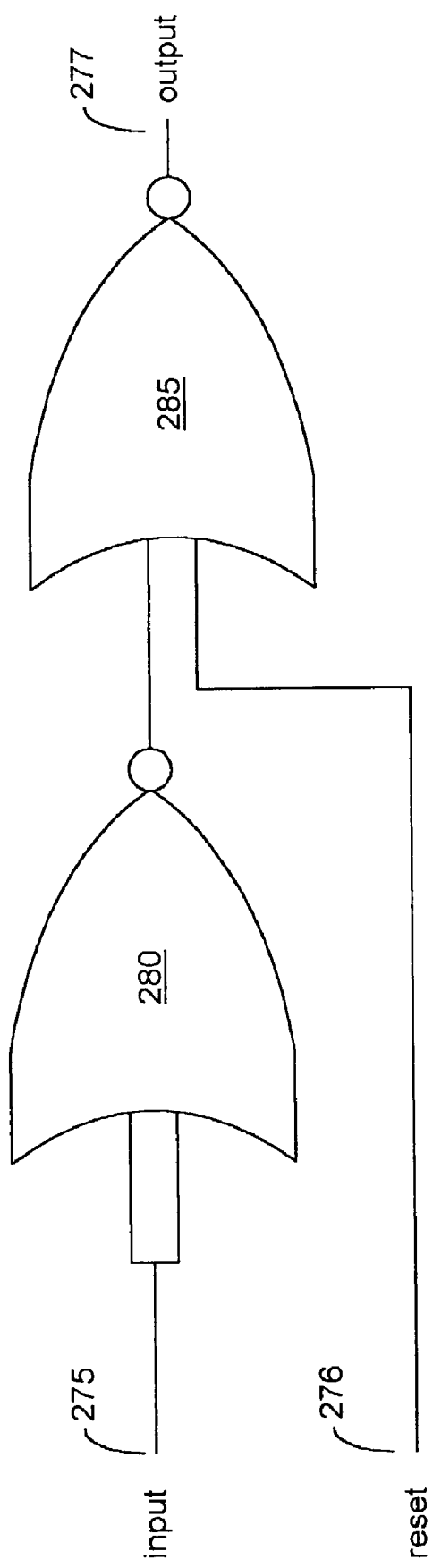
FIG. 2E shows an example of a delay cell in accordance with an embodiment of the present claimed invention.

FIG. 2E shows an example of a delay cell in accordance with an embodiment of the present invention. A first NOR gate 280 comprises two inputs that are tied together to form a single input 275. A second NOR gate 285 as one input coupled to the output of NOR gate 280 and another input coupled to a reset input 276. The output 277 of NOR gate 285 provides the output for the delay cell. Multiple delay cells may be combined to form a delay element with a greater delay. Standard library cells may be used as building blocks for delay elements.

In a conventional linear delay line, the flip-flops associated with the taps (shown in FIG. 1) may have difficulty resolving the output of a delay element if the sample pulse is received when the output of the delay element is in transition.

Figure 2F:
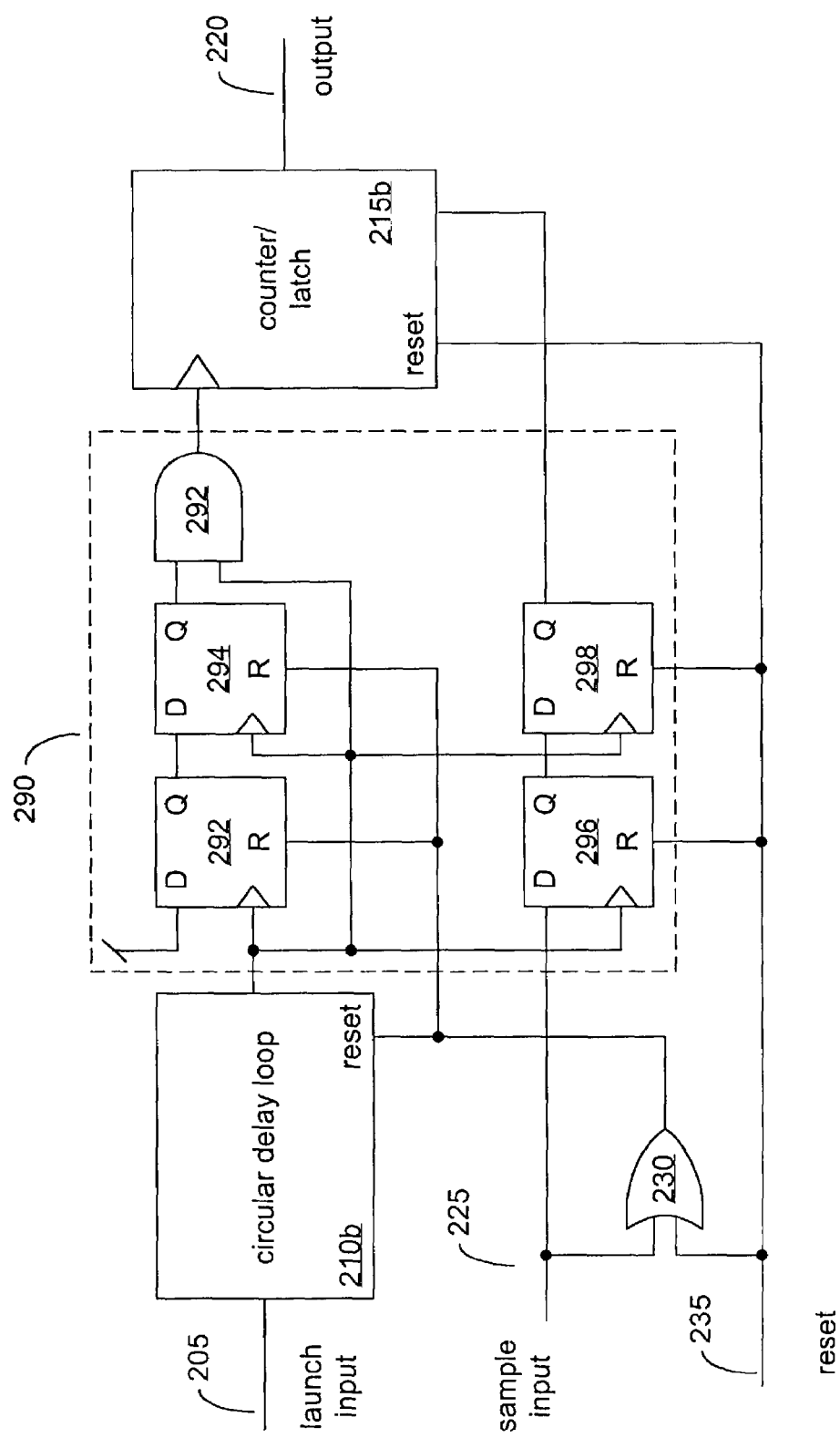
FIG. 2F shows an example of a synchronization circuit in accordance with an embodiment of the present claimed invention.

FIG. 2F shows an example of a synchronization circuit 290 that may be used to minimize problems associated with transition metastability. The circuit 290 is shown inserted between the circular delay loop 210b, and the counter latch/215b, of the circuit shown in FIG. 2C.

The synchronization circuit 290 synchronizes the sample pulse applied at input 225 with the output of the circular delay loop 210b before sending it to the counter/latch 215b to latch in the count value. The synchronization is achieved by utilizing the output pulses of the circular delay loop 210b as clock pulses that are applied to flip-flops 292, 294, 296, and 298. The output of the synchronization circuit 290 is provided by the AND gate 292.

In the synchronization scheme shown in FIG. 2F, flip-flops 296 and 298 produce a two pulse delay on the arrival of the sample signal to the counter/latch 215b. This delay may be compensated for by adding the same delay on the clock port of the counter/latch block (e.g., flip-flops 292 and 294).

The structure of counters and latches enable the implementation of self test for the configuration of FIG. 2F, as compared to the linear delay line of FIG. 1A. This is important for manufacturing considerations. By providing, for example, test ports for launch and sample pulse, each bit of the counter may be checked for functionality during testing. In comparison, there is no straightforward method for testing the linear delay line in production test.

In general, a resetable delay element may comprise a chain of several gates of varying types. The selection of the gate types is made so that a reset signal applied to the delay element fixes the output, while the absence of the reset signal allows an alternating signal at the input to appear at the output. The overall delay value may be varied by adding or subtracting gates from the chain. A delay element is preferably designed from standard cells used in the design of the IC.

Figure 3:
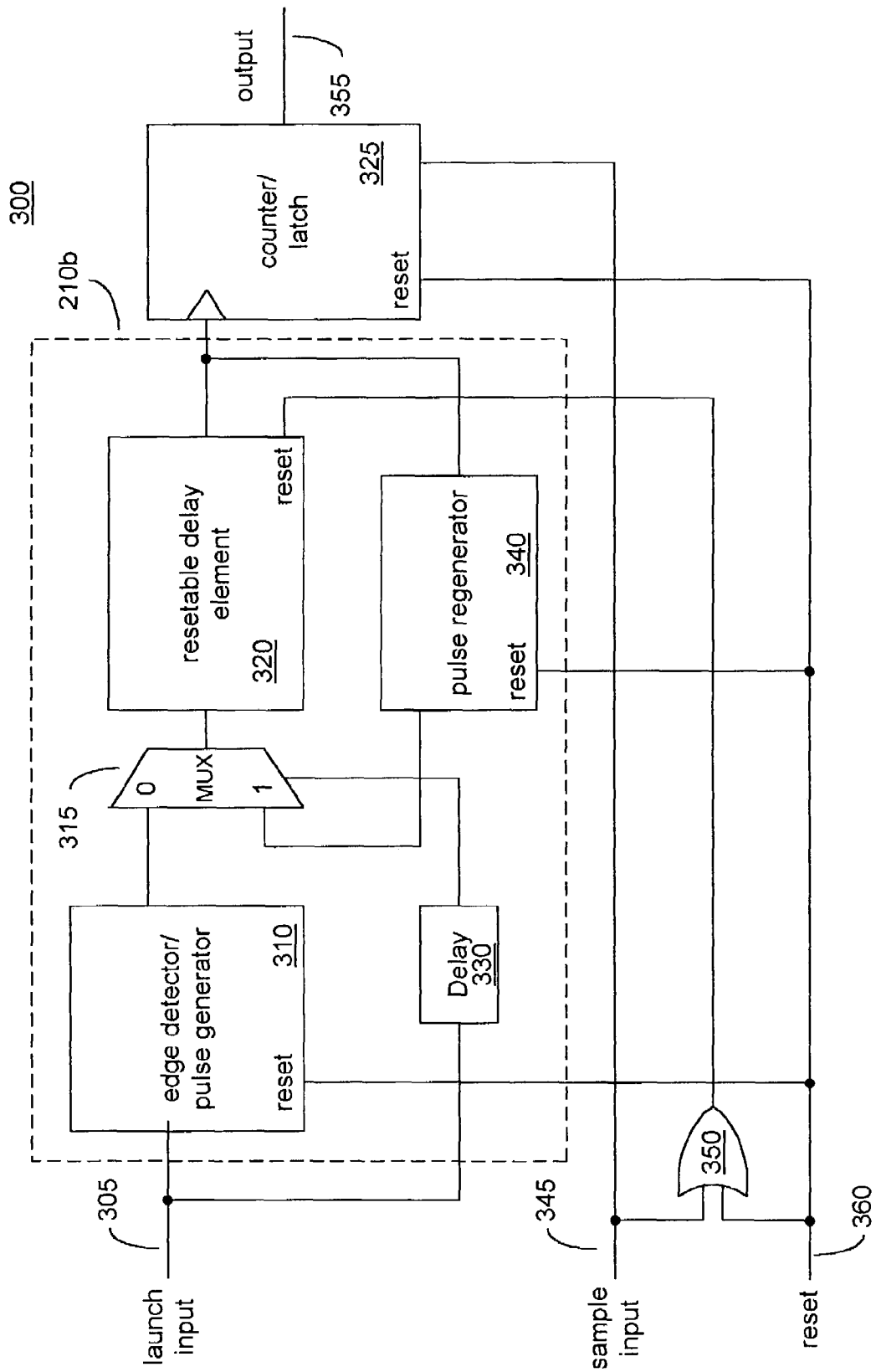
FIG. 3 shows a circulating delay loop comprising a multiplexed edge detector/pulse generator in accordance with an embodiment of the present claimed invention.

FIG. 3 shows circular delay loop 300 comprising a multiplexed edge detector/pulse generator 310 in accordance with an embodiment of the present invention. The launch input 305, sample input 345, reset input 360, OR gate 350, counter/latch 325, and output 355 of the circular delay loop 300 are similar to the launch input 205, sample input 225, reset input 235, OR gate 230, counter/latch 215b, and output 220 of FIG. 2C.

The edge detector/pulse generator 310 detects the edge of an input pulse at launch input 305 and applies a pulse to the first input (0) of multiplexer 315, which passes the pulse to the resetable delay element 320. The delay element 330 also receives the pulse from the launch input 305. Shortly after the multiplexer receives the pulse from the edge detector/pulse generator 310, the control input of the multiplexer 315 receives the delayed launch input pulse and switches the multiplexer to the second input (1).

The pulse input to the resetable delay element 320 appears at the input to the counter/latch 325 after a finite delay and is counted. The delayed pulse also appears at the input to the pulse regenerator 340. The pulse regenerator 340 applies a pulse to the second input (1) of the multiplexer 315, which passes the pulse to the resetable delay element 320. After a finite delay, the regenerated pulse appears at the input of the counter/latch 325 and the pulse generator 340. The process of pulse counting and regeneration continues until the edge of a sample input pulse is received by the counter/latch 325, at which time the count value is latched. The sample input pulse also causes the resetable delay element to be reset.

The pulse regenerator provides a consistent pulse input to the multiplexer 315, and prevents distortion of the pulse waveform from accumulating during multiple passes through the resetable delay element 320. The latched pulse circulation count value is made available to the slack detector so that evaluation of the slack can be made and the supply voltage adjusted in the IC.

After the supply voltage in the IC has been adjusted, the process described above may be repeated until the pulse circulation count value meets a desired value, or falls within a desired range of values.

Figure 4A:
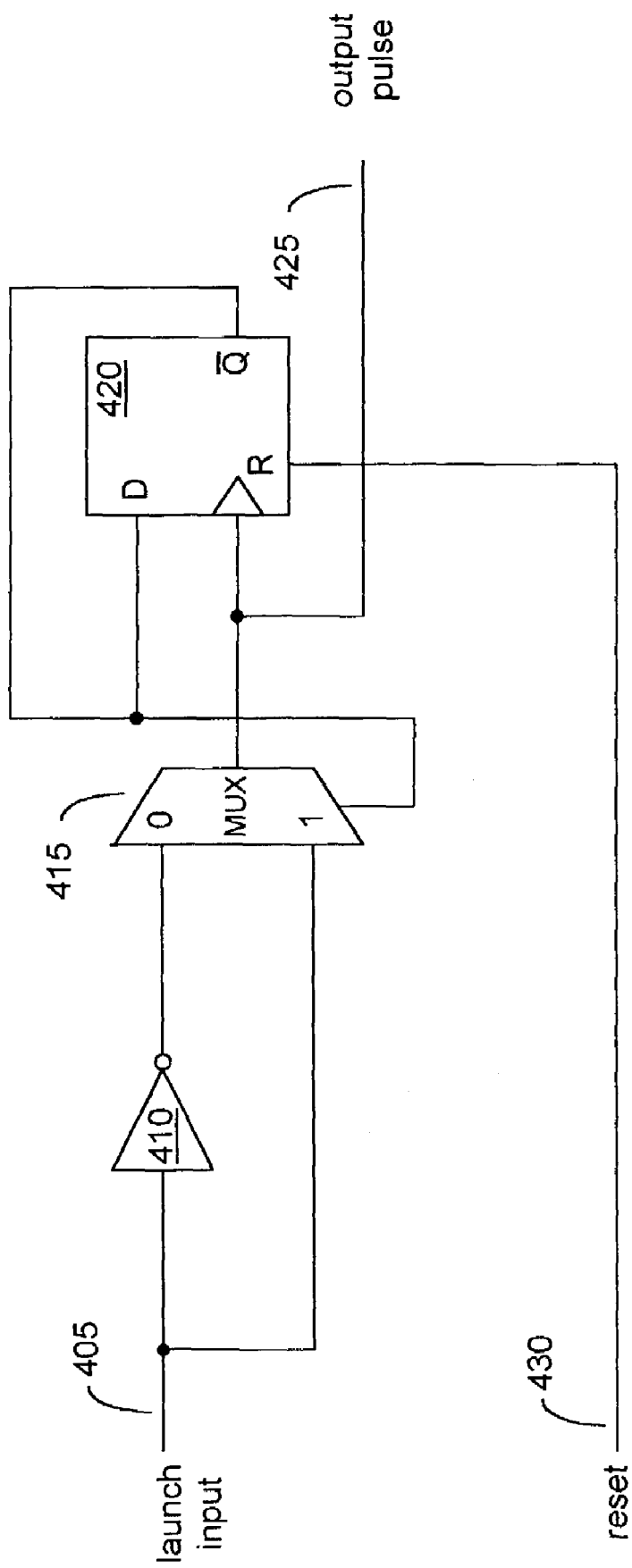
FIG. 4A shows a schematic diagram for an example of an edge detector/pulse generator circuit in accordance with an embodiment of the present claimed invention.

FIG. 4A shows a schematic diagram for an example of an edge detector/pulse generator circuit 310 in accordance with an embodiment of the present invention. The launch input 405 is coupled to the input of an inverter 410, and to the second input (1) of the multiplexer 415. The output of the inverter 410 is coupled to a first input (0) of a multiplexer 415. The output of the multiplexer 415 is coupled to the clock input of a flip-flop 420, and the reset input 430 is coupled to the reset input R of the flip-flop 420. The Q output (Qbar) of the flip-flop 420 is coupled to the control input of the multiplexer 415. The output 425 of the edge detector/pulse generator is coupled to the output of the multiplexer 415.

Figure 4B:
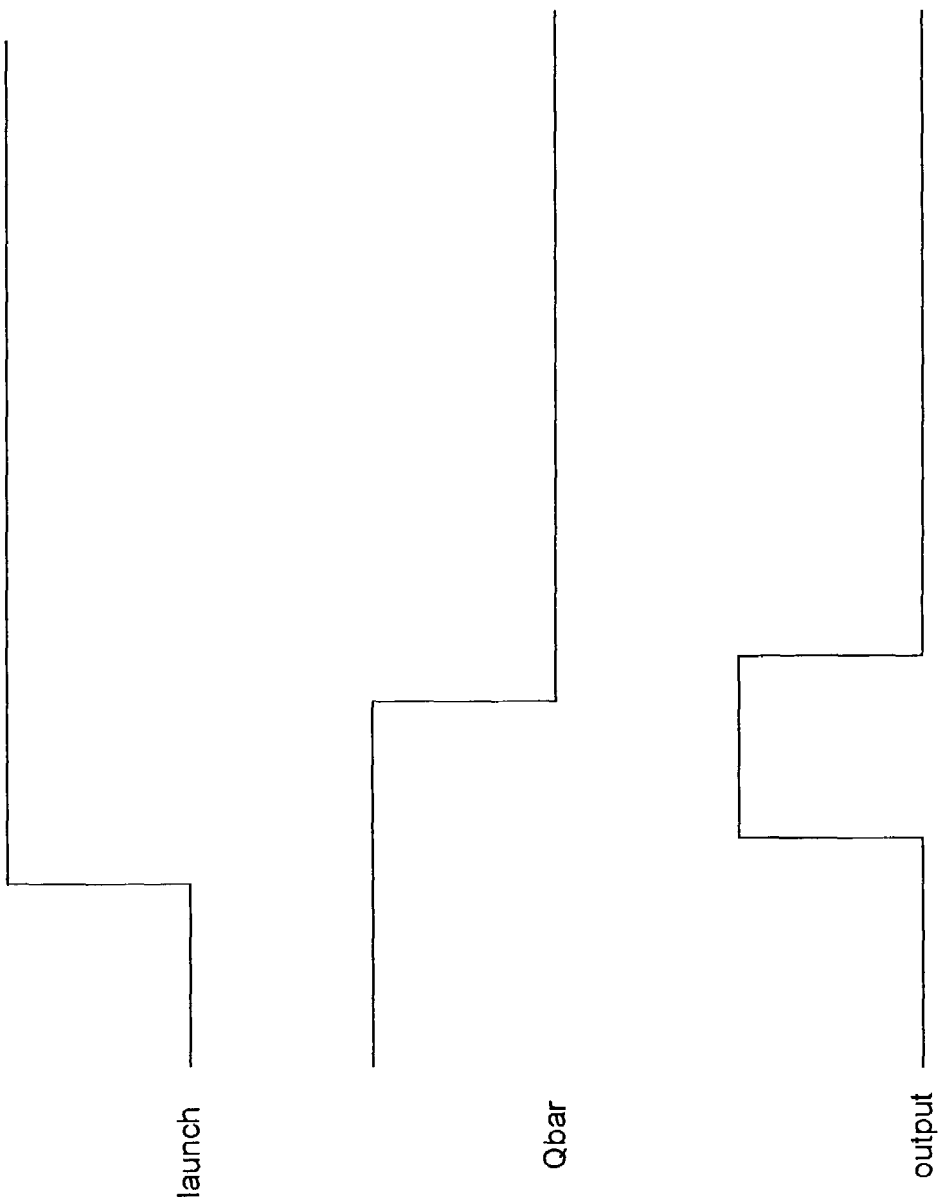
FIG. 4B shows a timing diagram for the edge detector/pulse generator of FIG. 4A.

FIG. 4B shows a timing diagram for the edge detector/pulse generator of FIG. 4A. The application of a rising edge at launch input 405 propagates through the second input (1) of the multiplexer 415 and appears at the output 425, thereby creating the rising edge of the output pulse of FIG. 4B. The output Qbar of the flip-flop 420 switches low, causing the multiplexer 415 to switch to the first input (0), thereby causing the output of the multiplexer 415 to switch low, and producing the falling edge of the output pulse of FIG. 4B.

Figure 5A:
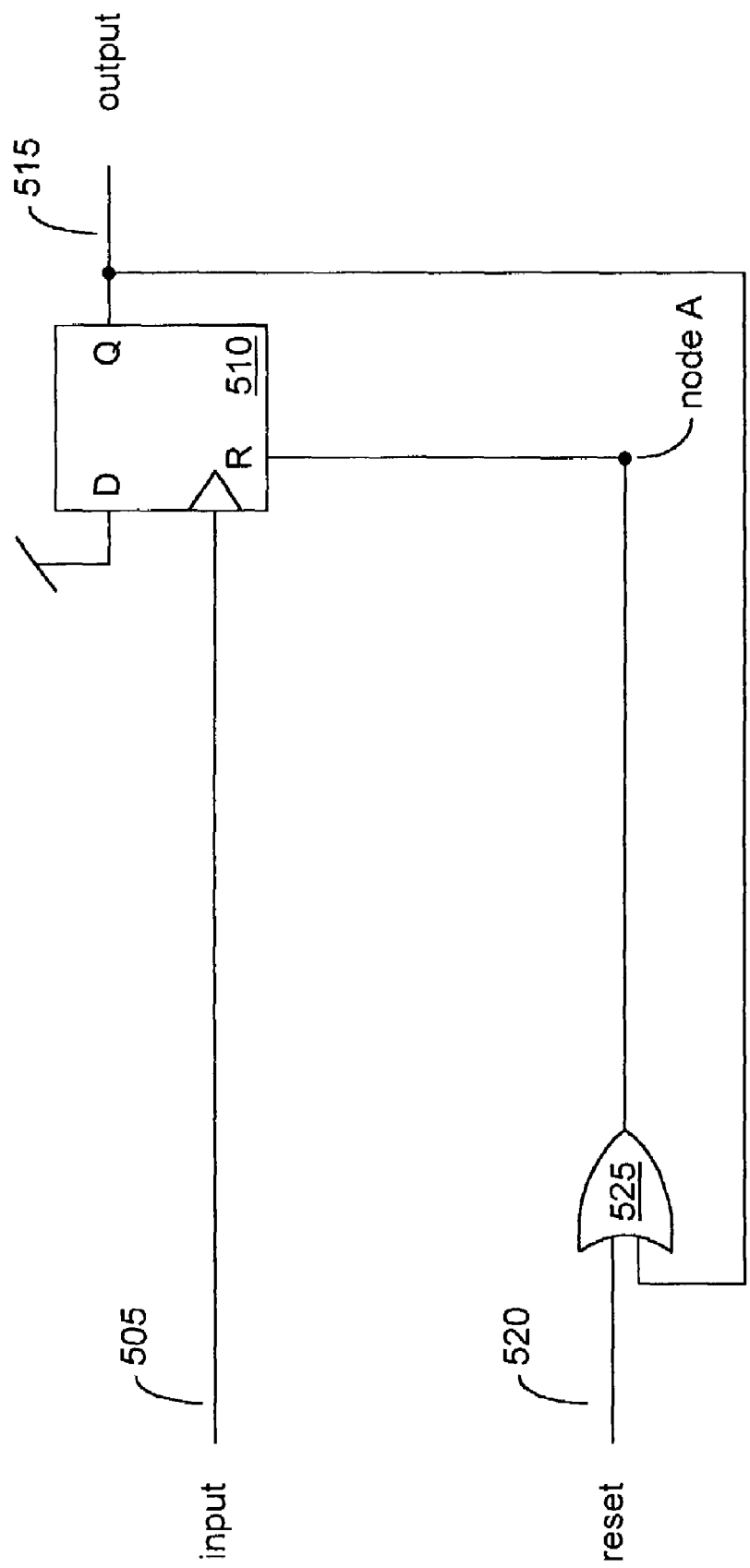
FIG. 5A shows a schematic diagram for a pulse regenerator circuit in accordance with an embodiment of the present claimed invention.

FIG. 5A shows a schematic diagram for the pulse regenerator circuit 340 of FIG. 3 in accordance with an embodiment of the present invention. The input of the pulse regenerator 505 is coupled to the clock input of the flip-flop 510. The output of the pulse regenerator 515 is coupled to the Q output of the flip-flop 510. The Q output of the flip-flop is also coupled to one input of an OR gate 525. The other input of the OR gate 525 is coupled to the reset input 520. The output of the OR gate 525 is coupled to the reset input R of the flip-flop 510.

Figure 5B:
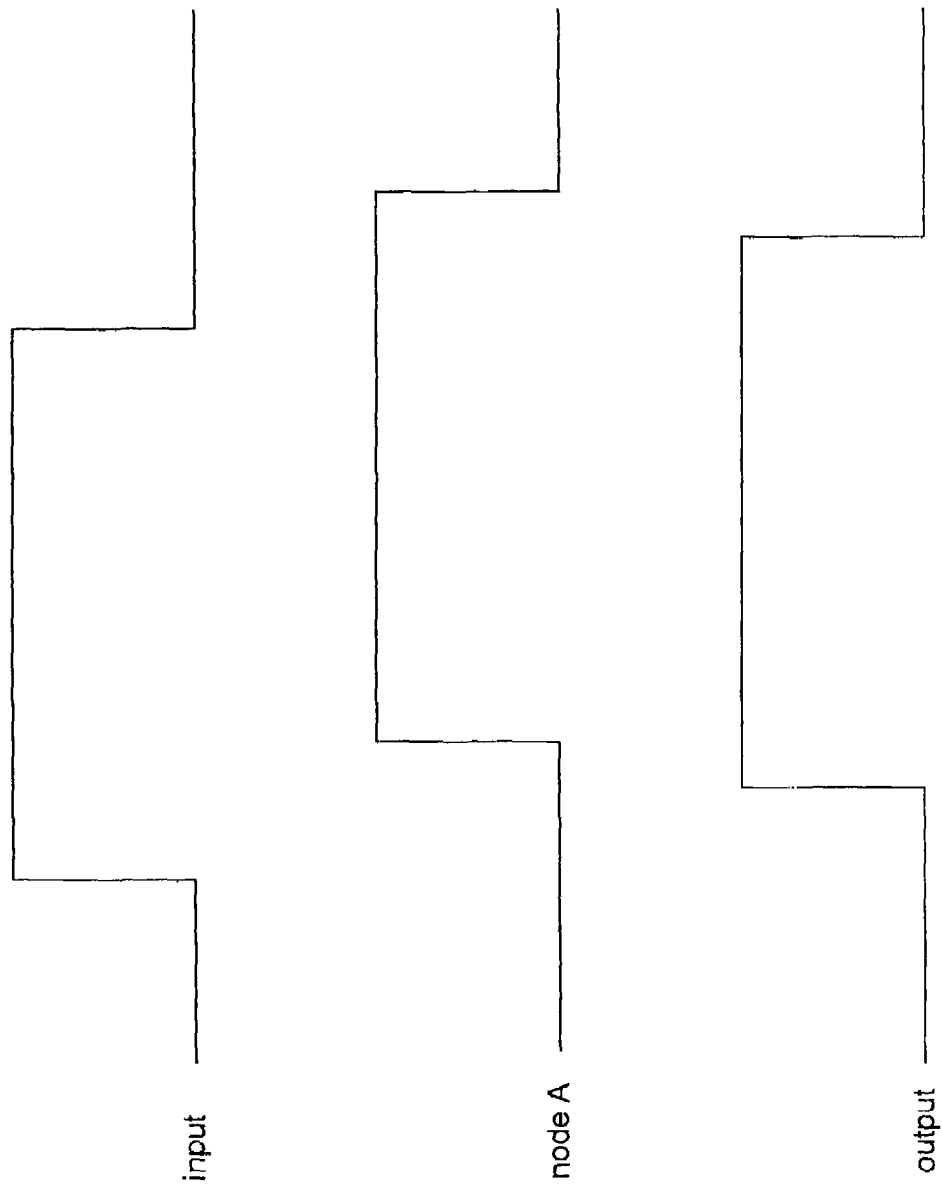
FIG. 5B shows a timing diagram for the pulse regenerator of FIG. 5A.

FIG. 5B shows a timing diagram for the pulse regenerator of FIG. 5A. The rising edge of the input pulse to the pulse regenerator causes the output 515 to switch high, producing the rising edge of the output pulse in FIG. 5B. The output of OR gate at node A subsequently switches high as shown in FIG. 5B. This transition is detected at the R input put of the flip-flop, and the Q output of the flip-flop 510 switches low, producing the falling edge of the output pulse in FIG. 5B.

Figure 6:
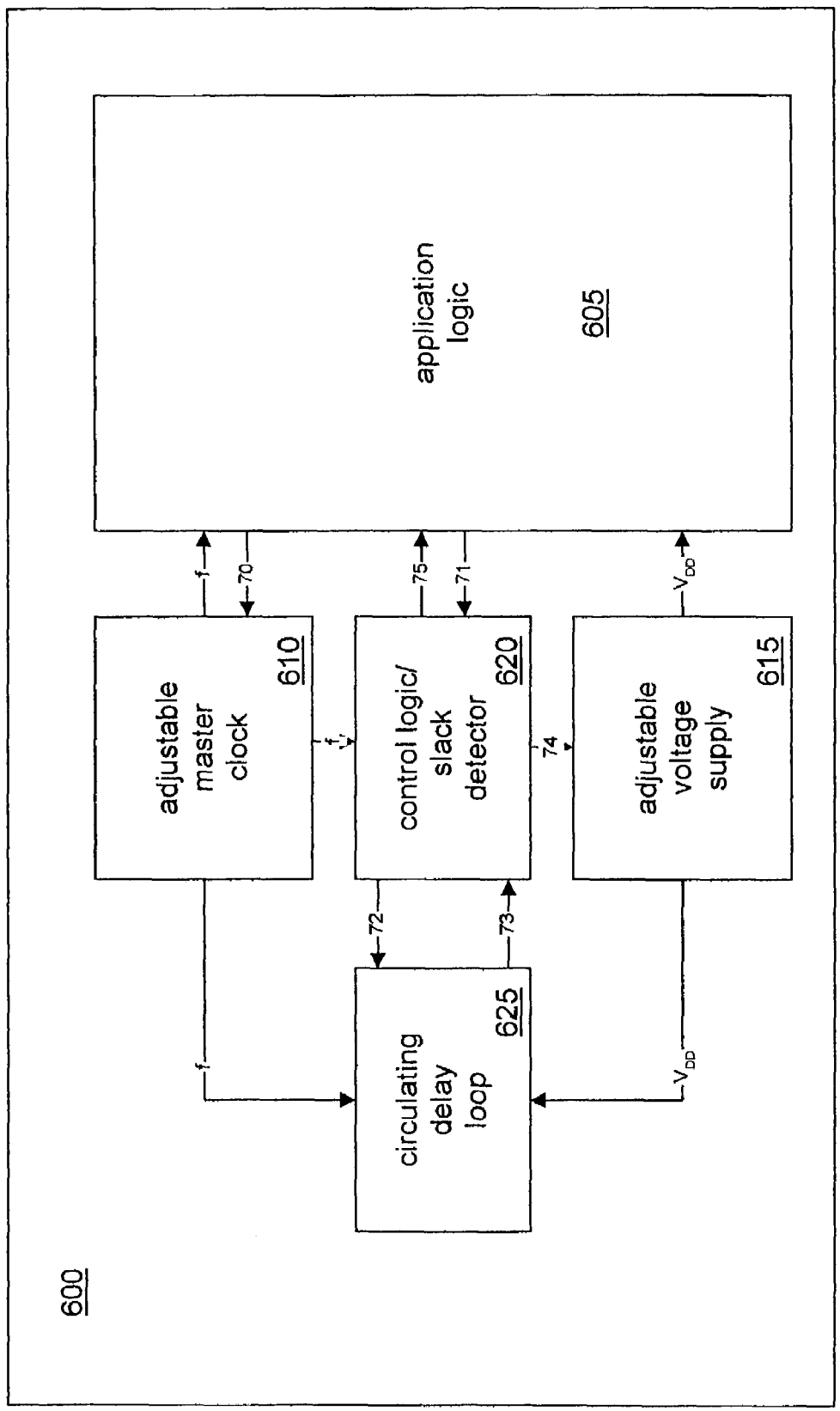
FIG. 6 shows diagram of an integrated circuit with an adjustable voltage supply, adjustable master clock and an adaptive voltage scaling slack detector in accordance with an embodiment of the present claimed invention.

FIG. 6 shows diagram of an integrated circuit 600 comprising application logic 605 for executing application program instructions. The application logic is coupled to an adjustable master clock 610 that provides a clock signal with a frequency f to the application logic 605. The application logic 605 may optionally provide instructions 70 to the clock 610, causing the output frequency f to change. External signals (not shown) may also be used to adjust the clock frequency f.

A control logic/slack detector circuit 620 is coupled to the application logic 605. Since application program execution may be suspended during the adjustment of operating voltage, status information 75 (e.g., completion of voltage adjustment) may be passed to the application logic. The application logic may pass status information and/or commands 71 to the control logic/slack detector 620. For example, the application logic may inform the control logic/slack detector when program execution is complete prior to initiating voltage adjustment.

The adjustable voltage supply 615 provides the operating voltage to both the circulating delay loop 625 and the application logic 605. The circulating delay loop 625 operates at the same frequency f, and supply voltage $V_{DD}$ as the application logic 605. The circulating delay loop 625 receives control input 72 from the control logic/slack detector 620. The control input 72 may include launch, sample, and reset signals. The circulating delay loop 625 provides delay information 73, comprising a pulse circulation count.

Figure 7:
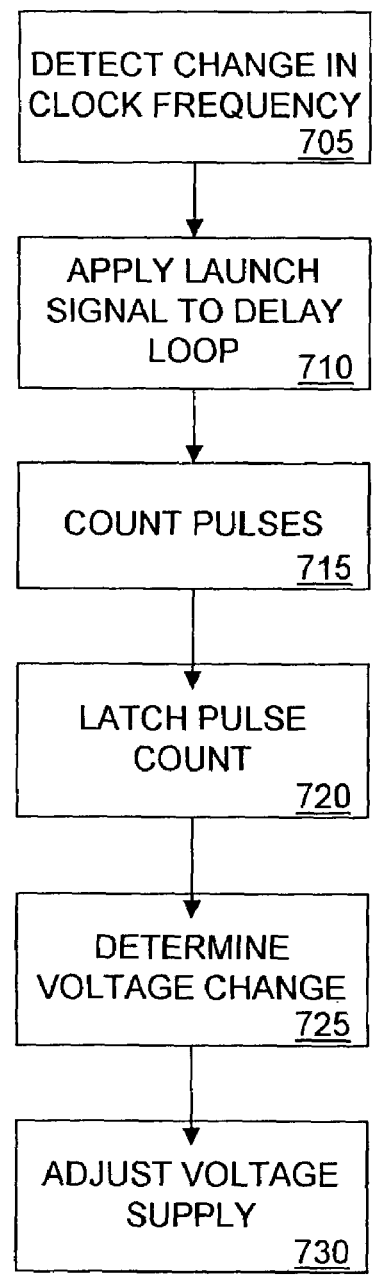
FIG. 7 shows a flow diagram for a method of adjusting voltage in a logic circuit in accordance with an embodiment of the present claimed invention.

FIG. 7 shows a flow diagram 700 for a method of adjusting voltage in a logic circuit such as that shown in FIG. 6. In step 705, a change in clock frequency is detected. The change in clock frequency may be detected directly, or it may be passed as information to the control logic/slack detector 620.

In step 710, a launch signal is applied to the circulating delay loop 625. The launch signal causes a pulse to circulate in the circulating delay loop 625. An example of a circulating delay loop is shown in FIG. 2A.

In step 715, the number of pulse circulations is counted. The circulation count comprise the number of times that a single pulse passes through the loop, or it may be comprise the number of passes made by an initial pulse and regenerated pulses.

In step 720, a sample signal is applied to latch the pulse circulation count (e.g., on the sample signal edge). In step 725, the change in voltage that is to be made in response to the frequency change is determined. This may be done by comparing pulse circulation count to a threshold value or desired range. If the pulse circulation count exceeds the threshold value or desired range, the voltage may be decreased. If the pulse circulation count is less than the desired threshold value or desired range, the voltage may be increased. If the pulse circulation count is at the threshold value or in the desired range, the voltage is left unchanged. In step 730, the voltage supply is adjusted.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications are suited to the particular use contemplated. It is intended that the scope of the invention be defined by the Claims appended hereto and their equivalents.

The invention claimed is:

1. A system for signal delay in an adaptive voltage scaling slack detector comprising:

an adjustable voltage supply;
a resetable delay loop circuit comprising a launch input and a first reset input, said launch input for receiving a launch pulse waveform, wherein said resetable delay loop circuit circulates a pulse in response to receiving said launch pulse waveform; and
a resetable counter/latch circuit comprising a second reset input, an output, an input coupled to an output of said resetable delay loop circuit, and a sample input, said counter/latch circuit for counting the number of times said pulse circulates in said resetable delay loop circuit, said sample input for receiving a sample pulse waveform, wherein said sample pulse waveform causes said resetable counter/latch to latch a pulse circulation count, wherein said adjustable voltage supply is adjusted based on said pulse circulation count.

2. The system of claim 1, further comprising an OR gate, said OR gate comprising a first input coupled to said sample input, a second input coupled to said second reset input, and an output coupled to said first reset input.

3. The system of claim 1, wherein said resetable delay loop circuit comprises:
a resetable delay element comprising a delay input, a reset input, and a delay output;
an XOR gate comprising a first input coupled to said launch input, a second input coupled to said delay output, and an output coupled to said delay input.

4. The system of claim 1, wherein said resetable delay loop circuit comprises:
an edge detector/pulse generator coupled to said launch input and to said first reset input;
a delay element coupled to said launch input;
a first multiplexer comprising a first switched input coupled to an output of said edge detector/pulse generator, and a control input coupled to an output of said delay element;
a pulse regenerator coupled to said first reset input and to a second switched input of said first multiplexer; and
a resetable delay element coupled to said first reset input, to an output of said first multiplexer, and to said pulse regenerator.

5. The system of claim 4, wherein said edge detector/pulse generator comprises:
an inverter coupled to said launch input;
a second multiplexer coupled to said inverter and to said launch input; and
a flip-flop coupled to a control input of said second multiplexer, and to an output of said second multiplexer.

6. The system of claim 1, wherein said sample input is coupled to said first reset input.

7. The system of claim 1, wherein said launch input is coupled to said second reset input.

8. A logic integrated circuit comprising:
an adjustable voltage supply;
an adjustable timing clock;
control logic for adjusting said adjustable voltage supply and said adjustable timing clock;
a delay loop circuit for circulating a pulse in response to receiving a launch pulse waveform; and
a counting and latching circuit coupled to said control logic and an output of said delay loop circuit, said counting and latching circuit for counting the number of times said pulse circulates in said delay loop circuit, wherein said counting and latching circuit latches a pulse circulation count upon receiving a sample pulse waveform, wherein said control logic adjusts said adjustable voltage supply based on said pulse circulation count.

9. The logic integrated circuit of claim 8, wherein said delay loop circuit comprises a multiplexer.

10. The logic integrated circuit of claim 8, wherein said delay loop circuit comprises an edge detector/pulse generator circuit.

11. The logic integrated circuit of claim 8, wherein said delay loop circuit comprises a launch input and a sample input.

12. The logic integrated circuit of claim 8, wherein said counting and latching circuit comprises a launch input and a sample input.

13. The logic integrated circuit of claim 8, wherein said delay loop circuit comprises an XOR gate coupled to a regenerative delay element.

14. The logic integrated circuit of claim 8, wherein said delay loop circuit comprises a standard cell.

15. A method for adaptive voltage scaling in an integrated circuit comprising an adjustable voltage supply with a value $V_{DD}$ in response to a frequency change of a master clock, comprising:
applying a launch pulse waveform to a circular delay loop circuit, thereby causing a pulse to circulate in said delay loop circuit;
counting the number of times said pulse circulates in said delay loop circuit with a counter/latch circuit;
applying a sample pulse waveform to said counter/latch circuit to latch a pulse circulation count in said counter/latch circuit; and
adjusting said adjustable voltage supply based on said pulse circulation count.

16. The method of claim 15, further comprising comparing said pulse circulation count to a predetermined slack threshold value.

17. The method of claim 16, further including increasing $V_{DD}$ by a predetermined amount if said pulse circulation count is less than said slack threshold value.

18. The method of claim 16, further including decreasing $V_{DD}$ by a predetermined amount if said pulse circulation count is greater than said slack threshold value.

19. The method of claim 17 wherein said launch pulse waveform overlaps said sample pulse waveform.

20. The method of claim 15, wherein said launch pulse waveform leads said sample waveform by ninety degrees.

* * * * *